(12) United States Patent  
Carson et al.

(10) Patent No.: US 6,682,354 B2
(45) Date of Patent: Jan. 27, 2004

(54) BOARD EDGE LAUNCH CONNECTOR

(75) Inventors: James C. Carson, Sugar Hill, GA (US); Sara Phillips, Alpharetta, GA (US)

(73) Assignee: EMS Technologies, Inc., Norcross, GA (US)

( * ) Notice: Subject to any disclaimer, the term of this patent is extended or adjusted under 35 U.S.C. 154(b) by 0 days.

(21) Appl. No.: 10/077,309

(22) Filed: Feb. 15, 2002

(65) Prior Publication Data

US 2002/0115314 A1 Aug. 22, 2002

Related U.S. Application Data

(60) Provisional application No. 60/269,446, filed on Feb. 16, 2001.

(51) Int. Cl.[7] .............................................. H01R 12/00
(52) U.S. Cl. ......................................... 439/63; 439/581
(58) Field of Search ..................... 439/63, 620, 447, 439/82, 83, 84, 581, 59; 437/876

(56) References Cited

U.S. PATENT DOCUMENTS

| 3,539,966 | A | * | 11/1970 | Logan ........................ 439/63 |
| 3,743,748 | A | | 7/1973 | Reeder |
| 4,163,598 | A | | 8/1979 | Bianchi et al. |
| 4,737,111 | A | | 4/1988 | Minar et al. |
| 5,293,177 | A | | 3/1994 | Sakurai et al. |
| 5,394,119 | A | | 2/1995 | Pleva et al. |
| 5,404,117 | A | | 4/1995 | Walz |
| 5,735,695 | A | | 4/1998 | Heinrich |
| 5,897,384 | A | | 4/1999 | Hosler, Sr. |
| 5,986,519 | A | | 11/1999 | Kellett et al. |
| 6,007,347 | A | | 12/1999 | Keldsen et al. |
| 6,053,743 | A | * | 4/2000 | Mitchell et al. .............. 439/63 |
| 6,065,976 | A | | 5/2000 | Wang |
| 6,106,304 | A | | 8/2000 | Huang |
| 6,123,550 | A | | 9/2000 | Burkert et al. |

\* cited by examiner

Primary Examiner—Tho D. Ta
Assistant Examiner—James R. Harvey
(74) Attorney, Agent, or Firm—King & Spalding LLP

(57) ABSTRACT

Using a method and apparatus for connecting an electrical cable to a circuit board. The connector is largely semi-circular in shape and generally comprises four prongs for attaching the connector to the edge of a circuit board. The connector is particularly useful for attaching a coaxial cable to a circuit board where the coaxial cable is not very flexible. The coaxial cable can be easily placed onto the connector. Once the coaxial cable is placed on the connector, the outer conductor can be attached to the connector and the inner conductor can be attached to the circuit board.

19 Claims, 5 Drawing Sheets

BOARD EDGE LAUNCH CONNECTOR

RELATED APPLICATION

The present application claims priority to U.S. provisional application entitled "Improved Board Edge Launch Connector," filed on Feb. 16, 2001, having Serial No. 60/269,446, the contents of which are hereby incorporated by reference.

FIELD OF THE INVENTION

This invention relates to connectors for attaching electrical cable to a circuit board. More particularly, the present invention provides a method and apparatus for easily and securely attaching an electrical cable to a circuit board.

BACKGROUND OF THE INVENTION

One problem encountered in a variety of industries today is the connection of an electrical cable to a circuit board. Circuit boards typically comprise some form of electric circuitry and can be used in a variety of conventional devices and processes. Circuit boards are typically made of a combination of materials such as metal traces positioned on relatively delicate substrate material, where the substrate material is often referred to as a dielectric. The electrical cables that need to be attached to the delicate circuit boards are often inflexible. The inflexibility of the cable and delicate nature of the circuit board make it difficult to create a connection between the cable and the circuitry on the circuit board that is mechanically and electrically secure.

This problem is particularly apparent in the field of antennas. Antennas, and particularly cellular antennas mounted on a pole at a base station, often have spatial constraints that make it desirable to construct an antenna of compact size. Aesthetic and environmental concerns can also control the size and shape of the antenna, which in turn impact the construction and assembly of the components within the antenna. The difficulty of assembling the antenna components in a small area is further complicated by physical constraints that ensure the components function properly. This difficulty is particularly acute in that portion of the assembly process where a power cable is connected to the dielectric circuit board within the antenna. Typically, an intermediate coaxial cable is used to connect an external power cable and the circuit board. Because the intermediate power cable is relatively short and stiff, it is difficult to achieve a secure connection with the circuit board. One common problem resulting from poor connections is degradation of the electrical signal caused by stresses in the connection between the power cable and the circuit board. In some instances the dielectric circuit board will crack or break because of its delicate nature.

PRIOR ART

The key to solving these problems lies in the design of the connector and how the connector is attached to the intermediate power cable and the dielectric circuit board. Existing connectors are difficult to work with in confined spaces and often produce connections with undue stresses that adversely affect the antenna. Attempts have been made to manufacture better connectors. Examples of more complex connectors are illustrated in U.S. Pat. No. 4,737,111, entitled "RF Connector for Use In Testing a Printed Circuit Board," and U.S. Pat. No. 6,106,304, entitled "Cable Connecting Head for Connecting to an Integral Circuit Board." However, there are limitations with the designs taught in these patents. First, the connectors do not facilitate simple and secure connection of the two conductors of a coaxial cable to a circuit board. Typically, it is necessary to solder the outer conductor to the circuit board ground and to solder the inner conductor to a trace connected to the circuit. The connector designs of the prior art do not allow for easy access to the outer and inner conductor for soldering. Second, the prior art connectors are expensive in that they require modification of the circuit board (drilling holes) and machining of a complex connector device. These additional costs make the designs prohibitive. Third, the designs taught in these two patents require turning and manipulation of the connector device to attach it to the circuit board. Maneuvering the connector device is difficult given the compact structure of cellular antennas.

Two other types of connectors that are generally used for this type of application are illustrated in FIGS. 1, 2, and 3. The connector shown in FIG. 1 is an example of a standard connector. The standard connector 2 connects intermediate cable 3 to circuit board 1. The intermediate cable 3 is then connected to an external power cable (not shown) via a DIN connector 4. The DIN connector is attached to the antenna tray 5, usually with rivets 6. The intermediate cable 3 comprises an outer conductor 7 and an inner conductor 8. The intermediate cable 3 is inserted into the distal hole 9 of the standard connector 2 such that the inner connector 8 protrudes from the proximal side of the standard connector 2. The outer conductor 7 can be soldered to the standard connector 2 and the inner conductor 8 can be soldered to the circuit board 1 at the microstrip trace line 10. The standard connector 2 also comprises two top stubs 11 and 12 and two bottom stubs 11' and 12' (not shown). The connector 2 is typically soldered to the circuit board 1 at stubs 11, 11', 12, and 12'.

The other type of conventional connector is called a clamp nut connector. An exemplary clamp nut connector, as manufactured by Amphanol Connectors, Inc. in Allentown, Pa., is shown assembled in FIG. 3 and unassembled in FIG. 2. The clamp nut connector 20 comprises a clamp nut 21, a threaded nut sleeve 22, a ferrule 23, and a connector assembly 24. The process for connecting the intermediate cable 25 with a clamp nut connector differs somewhat from the process for a standard connector. With the clamp nut connector, the intermediate cable 25 is fed through the clamp nut 21 and the threaded nut sleeve 22. The ferrule 23 is then attached to the end of the intermediate cable 25 and soldered to the cable's outer conductor 26. The connector assembly 24 is inserted onto the edge of a circuit board 33 such that upper stubs 29 and 32 rest on the top of the circuit board 33 and the lower stubs 30 and 31 are beneath the circuit board 33. Each stub 29, 30, 31, and 32 is soldered to the circuit board 33 securing the connector assembly 24. The ferrule 23 is then inserted into the connector assembly and secured by tightening the clamp nut 21. Finally, the inner conductor 27 can be soldered to the circuit board 33. The problem with the clamp nut connector is that it requires the machining of several more parts than the standard connector. These additional parts add to the cost of the connector and also add additional steps to the antenna assembly process. Furthermore, manipulation of the clamp nut 21 in the confined space of an antenna system also causes unwanted movement and stress on the solder connections with the circuit board 33.

The rigid nature of the intermediate cable 3, 25 causes stresses in the various solder points of the connection. These stresses can be exacerbated by the fact that the shape of the standard connector 2 and the clamp nut connector 20 make it difficult to form secure solder joints. The resulting stresses can adversely affect the performance of the antenna. In an ideal antenna manufacturing process, the first two steps would involve attaching the DIN connector 4 to the antenna tray 5 and attaching the intermediate cable 3, 25 to the DIN connector 4. Then later in the manufacturing process, the intermediate cable 3, 25 would be attached to the circuit board 1, 33 via a connector.

Using a standard connector 2 or a clamp nut connector 20, the actual antenna manufacturing process occurs in the reverse order of the ideal process. The structure of the conventional connectors and the compact spatial constraints of cellular antennas require that the intermediate cable 3, 25 be connected to the circuit board 1, 33 first. Subsequently, the intermediate cable 3, 25 is bent and fed into the cylindrical opening of the DIN connector 4. The process of bending the intermediate cable 3, 25 and attaching it to the DIN connector 4, increases the problems associated with stresses accumulating in the solder connections at the connector.

In view of the foregoing, there is a need in the art for a connecting device that is inexpensive to manufacture and simple to use. Specifically, there is a need for a connector that comprises a single body that can be cheaply produced in large quantities. There is a further need for a connecting device that is compact and does not require significant manipulation in view of the compact design of an antenna. There is also a need for a connecting device that will adequately support connections between an electrical cable and a circuit board while minimizing the stresses in those connections.

SUMMARY OF THE INVENTION

The present invention comprises a method and a device for facilitating the connection of a cable to a circuit board. The present invention employs a connector having a simple design that will be inexpensive to manufacture. Simplifying the design of the connector streamlines the antenna assembly process. The design of the connector allows a manufacturer to create secure connections between the cable and circuit board while minimizing manipulation of the connector.

In one aspect, the invention comprises an apparatus for securing an electrical cable to a circuit board. The apparatus is a single-body, hollow half-cylinder shaped connector with at least one upper flange and at least one lower flange. The connector slides onto the edge of a circuit board so that the circuit board fits between the upper flange and the lower flange. Solder can be applied to attach the flanges of the connector to metal connection pads, metal traces, or other like structures on the circuit board. The connector comprises a semi-circular inner surface shaped to receive the cable. The connector is designed so that an inner conductor of the cable can rest on the circuit board and be soldered to the circuit. The connector can also have an aperture in its semi-circular tube portion for observing the soldering of the cable to the connector.

In another aspect, the invention comprises a method for attaching a cable to a circuit board using a connector. The method involves attaching to the edge of a circuit board a half-cylindrical shaped connector with a C-shaped groove. Flanges extending from one end along the axis of the connector fit above and below the circuit board. The connector's flanges can be soldered to the upper and lower surfaces of the circuit board. Once the connector is secured to the circuit board, its semi-circular design facilitates placement of the cable onto the inner surface of the C-shaped groove of the connector with little manipulation. The cable can then be soldered to the connector and the circuit board with minimal stress on the connection points.

These and other aspects of the invention will be described below in connection with the drawing set and the appended specification and claim set.

DETAILED DESCRIPTION OF THE EXEMPLARY EMBODIMENTS

Figure 1:
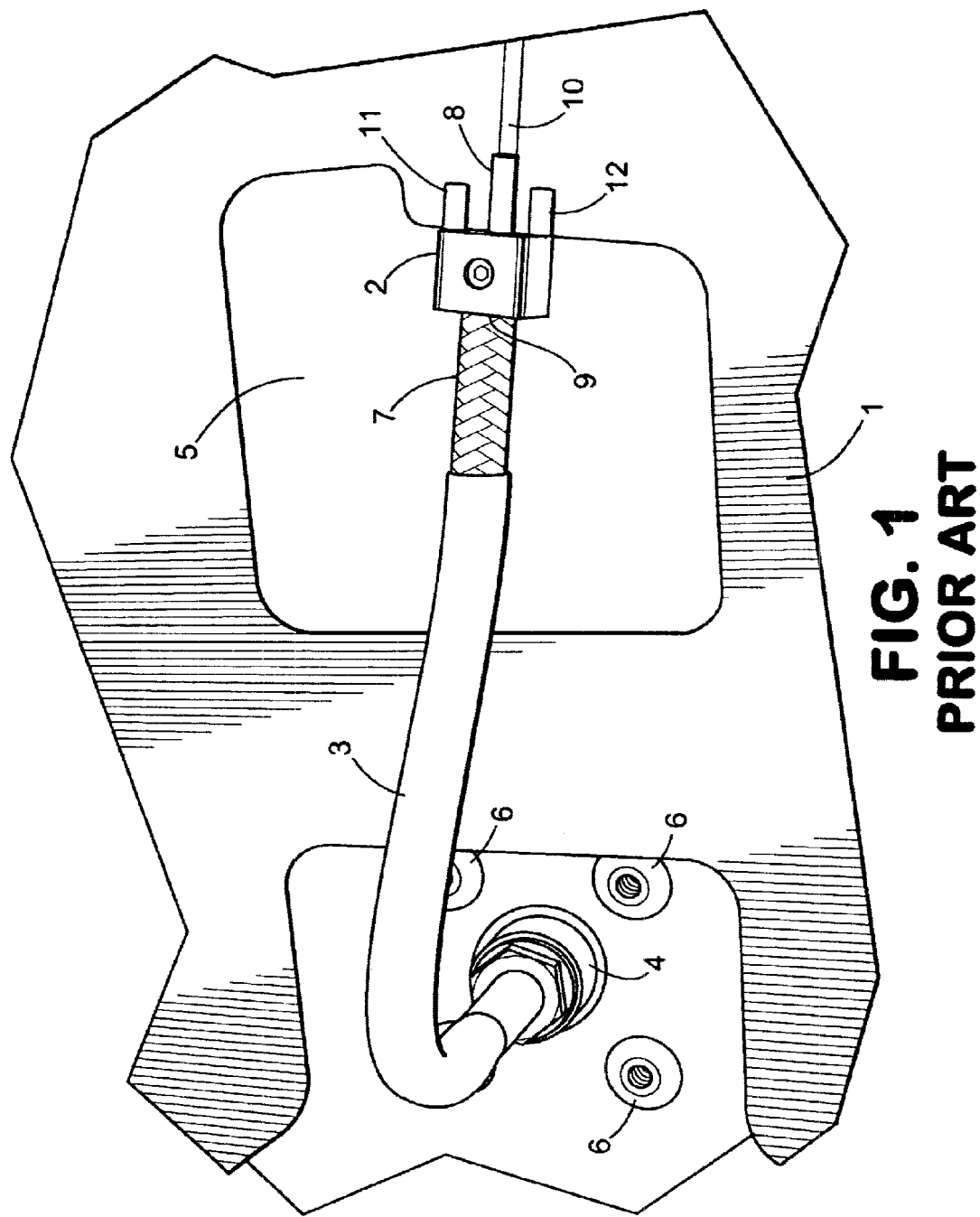
FIG. 1 is an exemplary illustration of an intermediate cable attached from a DIN connector to a cellular antenna dielectric circuit board using a standard connector of the prior art.
Figure 2:
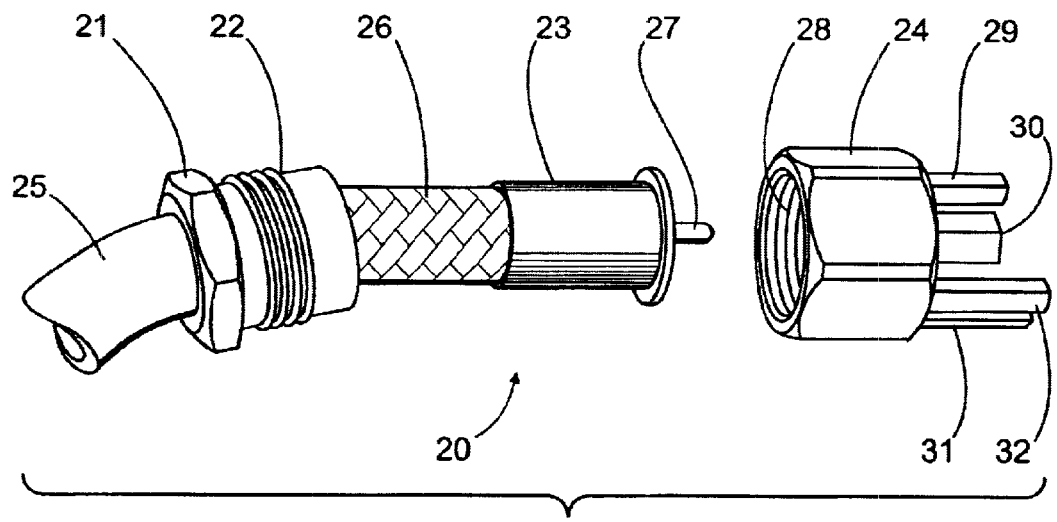
FIG. 2 shows exemplary connector pieces of an exemplary clamp nut connector of the prior art.
Figure 3:
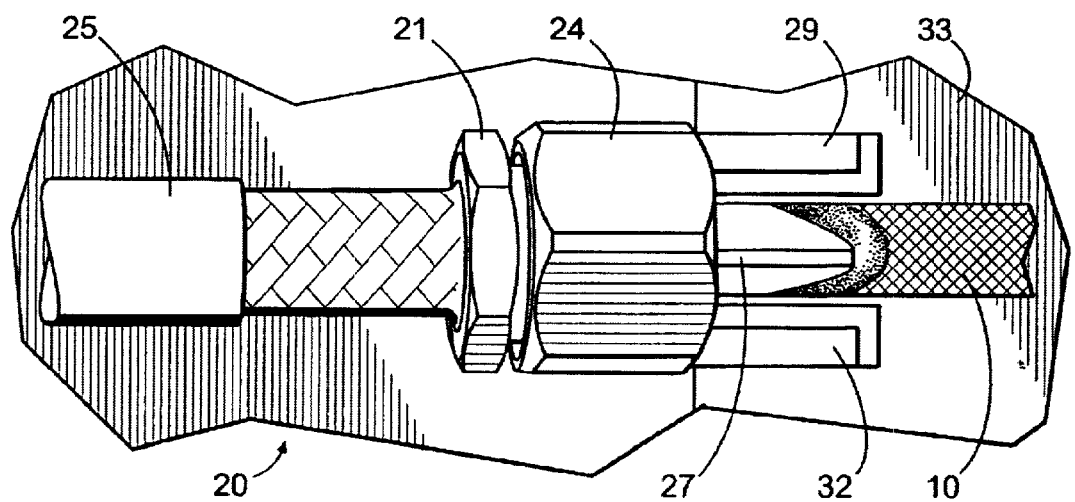
FIG. 3 is the exemplary assembled clamp nut connector of FIG. 2.

The present invention comprises a device and a method for facilitating the assembly of antenna components. The connection of the power cable to the circuit board within a typical antenna is typically a critical step in the manufacture of antennas. Because the power cable is relatively stiff and the circuit board typically comprises delicate material, it is difficult to achieve a secure connection that minimizes the stresses in the connection. The device of the present invention simplifies the attenna manufacturing or assembling process by providing an unobstructed connection for soldering the cable to the circuit board. It is noted that the terms "manufacturing" and "assembling" are not limited to activities that are performed by antenna manufacturers. The "manufacturing" and "assembling" mentioned in this description can include activities of after market equipment suppliers as well as end users of antennas. The method of the present invention minimizes the steps and manipulations that must be performed to complete the connection.

Referring now to the drawings, in which like numerals represent like elements throughout the several figures, exemplary embodiments of the present invention and the preferred environment in which it can be used will be described.

Figure 4A:
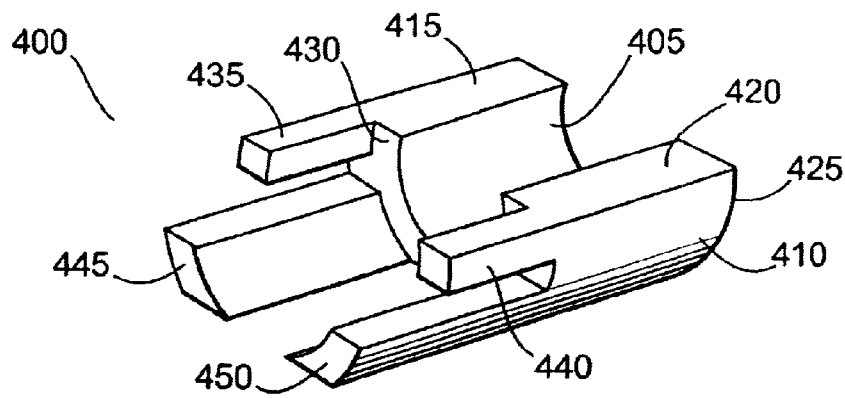
FIG. 4A presents an isometric view of an exemplary connector of the present invention.
Figure 4B:
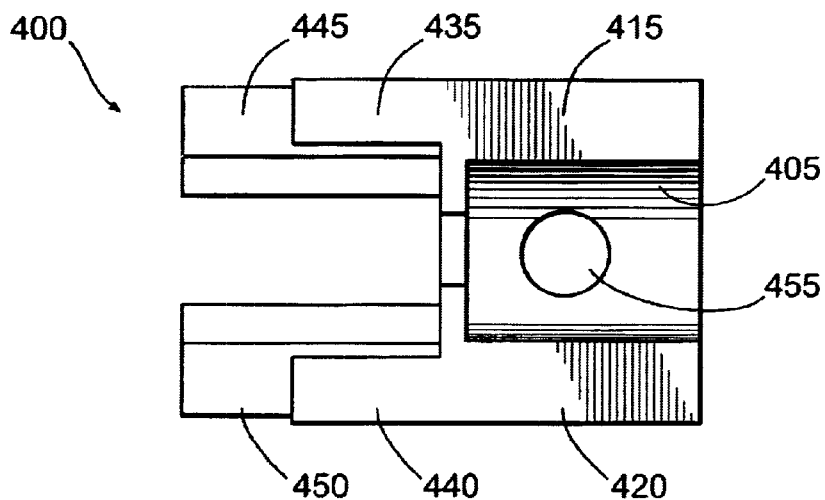
FIG. 4B presents a top view of an exemplary connector of the present invention.

FIG. 4A shows an isometric view of a connector device in accordance with an exemplary embodiment of the present invention. FIG. 4B shows a top view of the same connector device. The main body of the connector 400 comprises an inner semi-circular surface 405 and an outer semi-circular surface 410. The inner semi-circular surface 405 and the outer semi-circular surface 410 are joined along the longitudinal axis of the connector by a first lateral surface 415 and a second lateral surface 420. Along the radial axis of the connector, a distal semi-circular end surface 425 and a proximal semi-circular end surface 430 are disposed between the inner semi-circular surface 405 and the outer semi-circular surface 410. The proximal semi-circular end surface 430 contacts the edge of the circuit board whereas, the distal semi-circular end surface 425 is directed away from the circuit board. The foregoing surfaces of the connector 400 define a semi-circular tubular recess for receiving the coaxial cable. By defining an open recess without a top, the connector 400 allows for the placement of a coaxial cable directly on top of the connector 400, as opposed to feeding the cable through an opening as with the prior art connectors. The dimensions of the surfaces defining the connector 400 can be varied to accommodate coaxial cables of differing widths. Furthermore, alternative embodiments of the present invention can be used to connect other types of cables to circuit boards. The open-top design of the connector supports the connection of more rigid cables, such as one with a tin outer conductor.

Figure 4C:
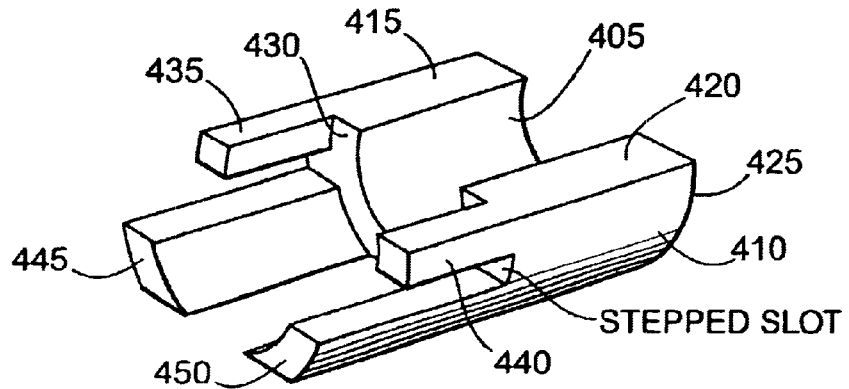
FIG. 4C presents an isometric view of an exemplary connector of the present invention with a stepped slot.

In addition to the main body of the connector 400, a series of flanges also extend outward from the proximal semi-circular end surface 430. The flanges typically comprise four individual members. In the exemplary embodiment illustrated in FIGS. 4A and 4B, the connector comprises a first top flange 435, a second top flange 440, a first bottom flange 445, and a second bottom flange 450. The top flanges 435 and 440 and the bottom flanges 445 and 450 define a slot into which a circuit board can be inserted. Generally, solder is then added at each flange to secure the connector to the circuit board. An aperture 455 can also be created in the main body of the connector 400. The aperture 455 allows the manufacturer to see how much solder has been added when attaching the intermediate cable 3 to the connector 400. In the embodiment illustrated in FIGS. 4A and 4B, the first bottom flange 445 and the second bottom flange 450 are longer than the first top flange 435 and the second top flange 440. In alternative embodiments of the present invention the lengths of the different flanges may vary or they all may be of equal length. Furthermore, the number of flanges may vary in alternative embodiments of the present invention. For example, the first bottom flange 445 and the second bottom flange 450 may be joined to form a single bottom flange. FIG. 4C illustrates yet another embodiment of the invention. FIG. 4C is identical to FIG. 4A except that the slot defined by two or more flanges is stepped to accommodate circuit boards of varying thickness.

Figure 5:
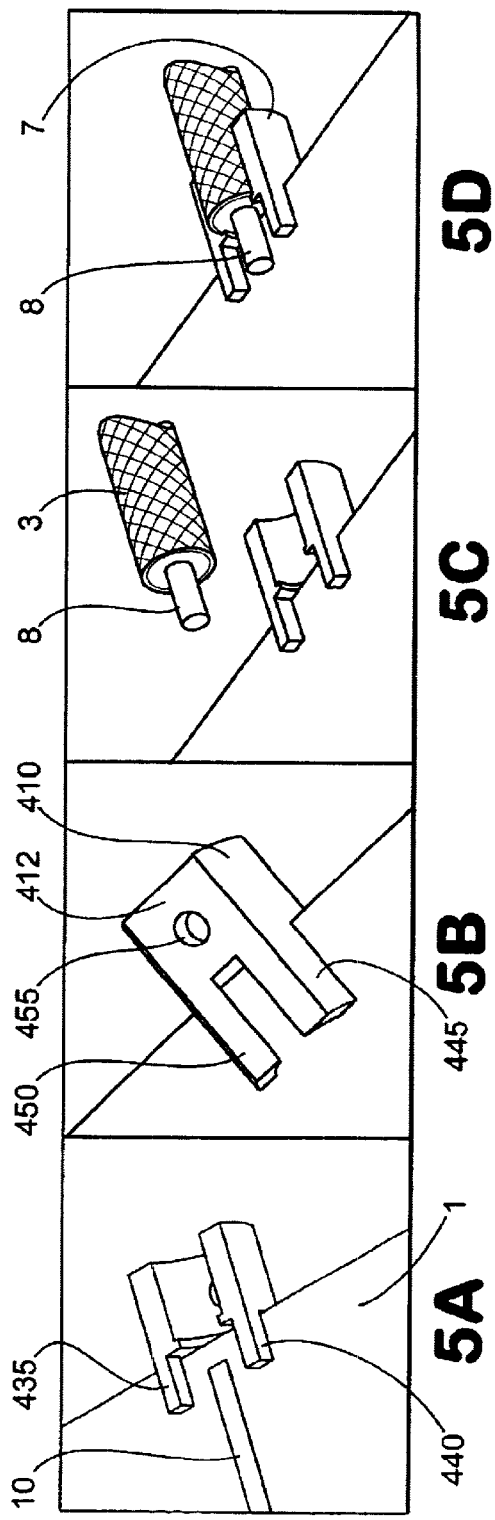
FIGS. 5A, 5B, 5C, 5D, and 5E illustrate steps for connecting a coaxial cable to a circuit board in accordance with an exemplary embodiment of the present invention.

Referring to FIG. 5, the physical components employed in an exemplary process using the connector 400 are shown. FIGS. 5A through 5D illustrate the exemplary steps of connecting the coaxial cable to the circuit board using the connector 400. In FIG. 5A, the connector 400 slides onto the edge of circuit board 1 with the first top flange 435 and the second top flange 440 visible from above. Usually, solder will be added to connect the first top flange 435 and the second top flange 440 to the top of the circuit board 1. In FIG. 5B, the circuit board 1 is inverted and the first bottom flange 445 and the second bottom flange 450 are soldered to the bottom of the circuit board 1. Generally, the first bottom flange 445 and the second bottom flange 450 are soldered to the circuit board ground. A portion of the outer semi-circular surface 410 can have a planar surface 412, as illustrated in the exemplary embodiment in FIG. 5B. In alternative embodiments of the present invention the outer semi-circular surface 410 may be completely rounded or may comprise a plurality of planar surfaces.

In FIG. 5C, the circuit board is turned back to the original position shown in FIG. 5A and the intermediate cable 3 can be easily placed into the recess defined by the connector 400. FIG. 5D shows the intermediate cable 3 resting in the recess defined by the connector 400. The foregoing process is in accord with the ideal manufacturing or assembling process discussed above. That is, the intermediate cable 3 can first be connected to the DIN connector 4 riveted to the antenna tray 5. Subsequently, the intermediate cable 3 can be bent to fit into the recess of connector 400 causing minimal stress to the solder connections with the circuit board 1. Once the intermediate cable 3 is in place, the outer conductor 7 is soldered to the connector 400 and the inner conductor 8 is soldered to the circuit board 1. FIG. 5E is an exemplary illustration of the finished product showing the intermediate cable 3 soldered to the connector 400 and the inner conductor 8 soldered to the trace 10 of the circuit board 1.

Figure 6:
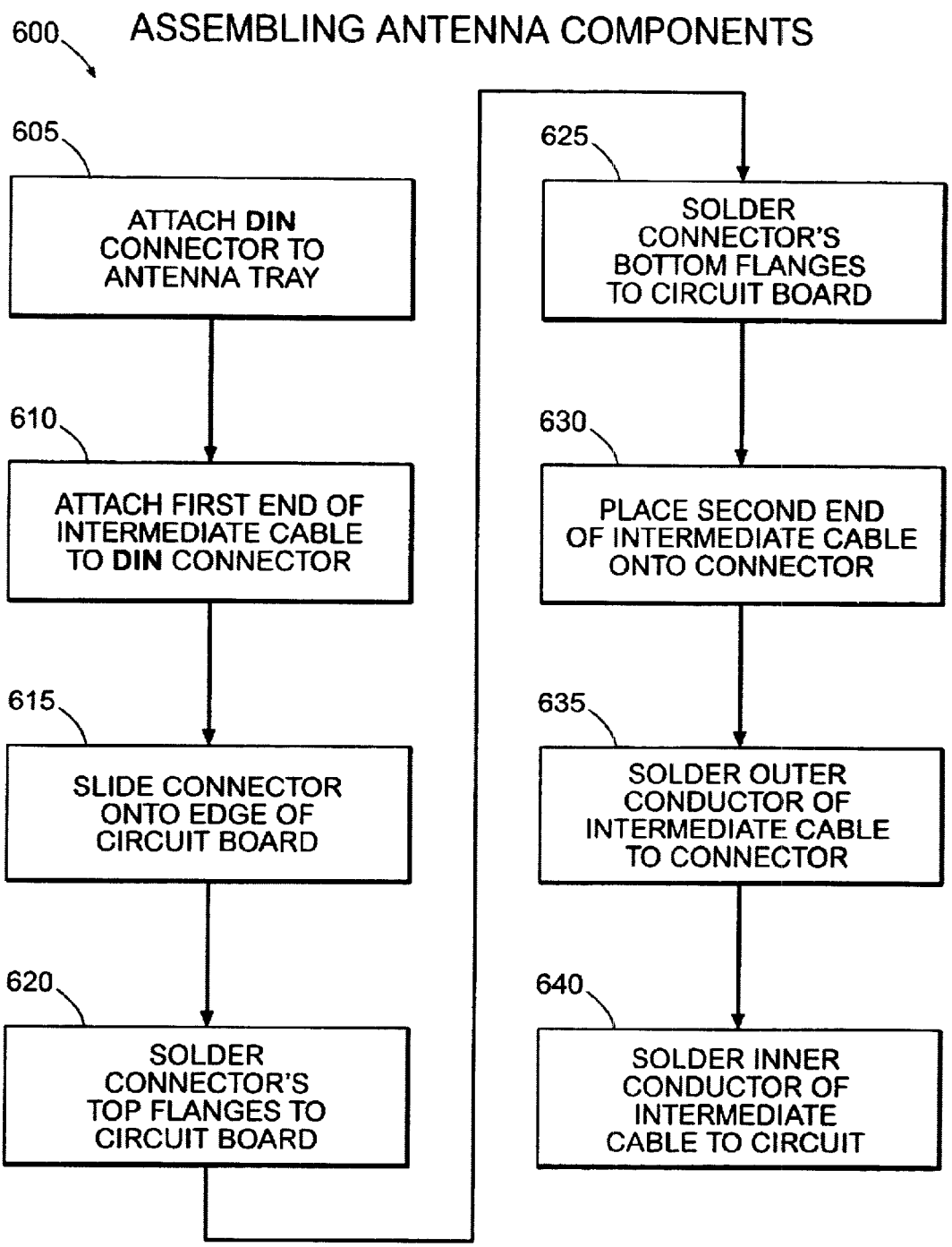
FIG. 6 is a flowchart diagram illustrating a process for connecting an electrical cable to a circuit board with a connector in accordance with an exemplary embodiment of the present invention.

Referring to FIG. 6, an exemplary process for connecting a cable to a circuit board in accordance with the present invention is illustrated. In step 605, the DIN connector 4 is attached to the antenna tray 5. The DIN connector 4 is the means by which an external power cord is connected to the intermediate cable 3 within the antenna. In step 610, the intermediate cable 3 is attached to the DIN connector 4. In alternative embodiments of the present invention connectors other than the DIN connector may be employed. Furthermore, in another embodiment of the invention the intermediate cable 3 may be eliminated completely and an external power cord may be connected directly to the circuit board 1. In step 615, the assembler slides the connector 400 onto the edge of the circuit board 1 and lines up the top flanges on either side of the trace 10 as shown in FIG. 5A.

In steps 620 and 625 the assembler solders the first top flange 435, the second top flange 440, the first bottom flange 445, and the second bottom flange 450 to the circuit board 1. Soldering is the general method used to make electrical connections to a circuit board. Alternative embodiments of the present invention may use other means to secure connections to the circuit board. Other means to secure connections can include, but are not limited to, adhesives and metallic fasteners. As illustrated in FIG. 5C, the end of the intermediate cable is then place in the recess of the connector 400 in step 630. In step 635, the outer conductor 7 of the intermediate cable 3 is soldered to the connector 400. The foregoing process requires little manipulation of the connector 400 and minimizes the stresses in the connection points with the circuit board 1. Finally, in step 640, the inner conductor 8 is soldered to the trace 10.

In conclusion, the present invention facilitates the connection of a cable to a circuit board in the assembly of antennas. The connector device is designed to be simple and inexpensive to manufacture and implement. The connector device requires little manipulation in the installation process and supports the creation of a secure connection while minimizing stresses.

It will be appreciated that the present invention fulfills the needs of the prior art described herein and meets the above-stated objects. While there has been shown and described the preferred embodiment of the invention, it will be evident to those skilled in the art that various modifications and changes may be made thereto without departing from the spirit and the scope of the invention as set forth in the appended claims and equivalents thereof. The above description and accompanying figures set forth an exemplary method and device for connecting a cable and a circuit board. However, the method and device of the present invention may be used in other types of electrical devices where such a connection is needed. The device can also be modified to accommodate cables of varying size and type, or multiple cable junctions.

What is claimed is:

1. A connector to facilitate connection of a cable to a circuit board comprising:

a hollow half-cylindrical body having a semi-circular cross-section, the body comprising an inner semi-circular surface, an outer semi-circular surface, a distal semi-circular end surface, a proximal semi-circular end surface, a first lateral surface disposed between a first bisected edge of the inner semi-circular surface and a first bisected edge of the outer semi-circular surface, a second lateral surface opposite the first lateral surface and disposed between a second bisected edge of the inner semi-circular surface and a second bisected edge of the outer semi-circular surface;

a bottom flange projection extending along the longitudinal axis of the cylindrical body and adjacent to the proximal semi-circular end surface and the outer semi-circular surface;

a first top flange projection extending along the longitudinal axis of the cylindrical body and adjacent to the proximal semi-circular end surface and the first lateral surface; and a second top flange projection extending along the longitudinal axis of the cylindrical body and adjacent to the proximal semi-circular end surface and the second lateral surface.

2. The connector of claim 1, further comprising a radial aperture extending through the outer semi-circular surface and the inner semi-circular surface, disposed substantially equidistant between the distal semi-circular end surface and the proximal semicircular end surface.

3. The connector of claim 2, wherein the radial aperture is further disposed substantially equidistant between the first lateral surface and the second lateral surface.

4. The connector of claim 1, wherein the bottom flange projection comprises a first bottom flange projection and a second bottom flange projection.

5. The connector of claim 1, wherein the outer semi-circular surface further comprises a planar surface, the planar surface disposed substantially equidistant between the first lateral surface and the second lateral surface.

6. The connector of claim 1, wherein the bottom flange projection is longer than the first top flange projection and the second top flange projection.

7. The connector of claim 1, wherein the bottom flange projection and the first top flange projection define a first slot and the bottom flange projection and the second top flange projection define a second slot.

8. The connector of claim 7, wherein the first slot and the second slot are substantially equal and designed for receiving a circuit board.

9. A method for assembling a connection to a circuit board comprising:

sliding a connector onto an edge of the circuit board, the connector comprising a hollow half-cylindrical body comprising a semi-circular cross-section;

attaching a first top flange projection and a second top flange protection of the connector to the circuit board, the first top flange projection and the second top flange projection extending along the longitudinal axis of the connector;

attaching a bottom flange projection of the connector to the circuit board, the bottom flange protection extending along the longitudinal axis of the connector;

placing a proximal end of a cable onto an inner semi-circular surface of the connector;

attaching an outer conductor of the cable to the connector; and attaching an inner conductor of the cable to the circuit board.

10. The method of claim 9, wherein attaching the bottom flange projection comprises:

attaching a first bottom flange projection to the circuit board; and attaching a second bottom flange projection to the circuit board.

11. The method of claim 9, further comprising attaching a distal end of the cable to an external connection.

12. The method of claim 11, wherein the step of attaching the distal end of the cable to an external connection is performed before placing the proximal end of the cable onto the inner semi-circular surface of the connector.

13. The method of claim 9, wherein the step of attaching an outer conductor of the cable to the connector further comprises observing the attaching through an aperture in the connector.

14. The method of claim 9, wherein the attachments are made by soldering.

15. A connector to facilitate connection of a cable to a circuit board comprising:

a half-cylindrical body comprising a semi-circular cross-section and a C-shaped groove defined by a top surface of the half-cylindrical body portion;

a bottom flange projection extending along the longitudinal axis of the half-cylindrical body and adjacent to an end surface of the half-cylindrical body;

a first top flange projection extending along the longitudinal axis of the half-cylindrical body and adjacent to the end surface of the half-cylindrical body; and a second top flange projection, opposite the first top flange projection, extending along the longitudinal axis of the half-cylindrical body and adjacent to the end surface of the half-cylindrical body.

16. The connector of claim 15, wherein the bottom flange projection comprises two individual flange members.

17. The connector of claim 15, wherein the bottom flange projection comprises a curved inner surface that is continuous with the top surface of the half-cylindrical body defining the C-shaped groove.

18. The connector of claim 15, wherein the bottom flange projection and the first top flange projection define a first slot and the bottom flange projection and second top flange projection define a second slot, the first slot and the second slot positioned for receiving a circuit board.

19. The connector of claim 15, wherein the bottom flange projection and the first and second top flange projections define a stepped slot for receiving circuit boards of varying thickness.

* * * * *